United States Patent
Lu et al.

(10) Patent No.: US 8,252,696 B2
(45) Date of Patent: Aug. 28, 2012

(54) SELECTIVE ETCHING OF SILICON NITRIDE

(75) Inventors: Xinliang Lu, Fremont, CA (US); Haichun Yang, Santa Clara, CA (US); Zhenbin Ge, San Mateo, CA (US); Nan Lu, San Jose, CA (US); David T. Or, Santa Clara, CA (US); Chien-Teh Kao, Sunnyvale, CA (US); Mei Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 936 days.

(21) Appl. No.: 12/247,059

(22) Filed: Oct. 7, 2008

(65) Prior Publication Data

US 2009/0104782 A1    Apr. 23, 2009

Related U.S. Application Data

(63) Continuation-in-part of application No. 11/876,649, filed on Oct. 22, 2007, now Pat. No. 7,871,926.

(51) Int. Cl.
*H01L 21/302* (2006.01)

(52) U.S. Cl. ......... 438/744; 438/714; 438/723; 438/738

(58) Field of Classification Search ............ 438/706, 438/710, 712, 714, 723, 724, 738, 744; 483/744; 216/72, 80
See application file for complete search history.

(56) References Cited

U.S. PATENT DOCUMENTS

| 4,529,476 A | * | 7/1985 | Kawamoto et al. | 438/724 |
|---|---|---|---|---|
| 6,149,828 A | | 11/2000 | Vaartstra | |
| 6,379,575 B1 | | 4/2002 | Yin et al. | |
| 6,746,961 B2 | * | 6/2004 | Ni et al. | 438/700 |
| 6,897,120 B2 | * | 5/2005 | Trapp | 438/424 |
| 7,288,482 B2 | | 10/2007 | Panda et al. | |
| 2003/0224617 A1 | * | 12/2003 | Baek et al. | 438/763 |
| 2007/0107750 A1 | | 5/2007 | Sawin et al. | |
| 2008/0124937 A1 | | 5/2008 | Xu et al. | |

OTHER PUBLICATIONS

International Search Report and Written Opinion mailed Apr. 26, 2010 for PCT Application No. PCT/US2009/059743.

* cited by examiner

*Primary Examiner* — Lan Vinh
(74) *Attorney, Agent, or Firm* — Moser Taboada; Alan Taboada

(57) ABSTRACT

Methods for etching dielectric layers comprising silicon and nitrogen are provided herein. In some embodiments, such methods may include providing a substrate having a dielectric layer comprising silicon and nitrogen disposed thereon, forming reactive species from a process gas comprising hydrogen ($H_2$) and nitrogen trifluoride ($NF_3$) using a remote plasma; and etching the dielectric layer using the reactive species. In some embodiments, an oxide layer is disposed adjacent to the dielectric layer. In some embodiments, the flow rate ratio of the process gas can be adjusted such that an etch selectivity of the dielectric layer to at least one of the oxide layer or the substrate is between about 0.8 to about 4.

16 Claims, 4 Drawing Sheets

SELECTIVE ETCHING OF SILICON NITRIDE

CROSS-REFERENCE TO RELATED APPLICATIONS

This application is a continuation in part of U.S. patent application Ser. No. 11/876,649, filed Oct. 22, 2007 by Li-Qun Xia, entitled, "Methods and Systems for Forming At Least One Dielectric Layer," which is hereby incorporated by reference.

BACKGROUND

1. Field

The present invention generally relates to semiconductor devices and structures for integrated circuits, and, more particularly, to methods for etching dielectric layers comprising silicon and nitrogen.

2. Description of Related Art

Semiconductor device geometries have dramatically decreased in size since their introduction several decades ago. Modern semiconductor fabrication equipment routinely produces devices with 250 nm, 180 nm, and 65 nm feature sizes, and new equipment is being developed and implemented to make devices with even smaller geometries. The smaller sizes, however, mean device elements have to work together in closer proximity to each other, which can increase the chances of electrical interference, including cross-talk and parasitic capacitance.

To reduce the degree of electrical interference, dielectric insulating materials are used to fill the gaps, trenches, and other spaces between the device elements, metal lines, and other device features. The dielectric materials are chosen for their ease of formation in the spaces between device features, and their low dielectric constants (i.e., "k-values"). Dielectrics with lower k-values are better at minimizing cross-talk and RC time delays, as well as reducing the overall power consumption of the device. One commonly-used dielectric material is silicon oxide.

Additionally, during the formation of semiconductor devices, silicon nitride dielectric films have been used as barriers or etch stop layers in various applications and may be formed adjacent to or proximate silicon oxide layers. Silicon nitride dielectric films may provide a desired protection for structures such as transistor gates, or metal contacts lying thereunder. During fabrication, dry chemical processes may be utilized in contact cleaning steps or a clean step prior to subsequent processing, such as, the formation of a silicide layer on the substrate. These conventional processes require the silicon oxide cleaning chemicals to adsorb or condense onto the surface of the wafer. However, lower condensation proximate a contact hole or trench bottom, as compared to the top (near the wafer surface) leads to lower silicon oxide removal at the contact hole (or trench) bottom than at the top surface. For pre-silicide and contact clean applications, the above processes have high oxide/silicon nitride etch selectivity.

However, for some applications, it is required to etch the silicon nitride. For example, if there is some residual silicon nitride left at the contact surface, the aforementioned high selectivity processes cannot be used to clean the silicon nitride from the surface without damaging the oxide layer. In other examples, even higher silicon nitride etch selectivity to oxide may be required. For example, for shallow trench isolation (STI) trench clean applications prior to the deposition of a silicon oxide liner, high silicon oxide to silicon nitride etch selectivity processes may cause an overhang to be formed near the top of the trench by undercutting the pad oxide layer below the silicon nitride layer, thereby forming trench defects after the trench fill.

Thus, there is a need in the art for improved etch processes for etching silicon nitride materials.

SUMMARY

A method for etching a dielectric layer comprising silicon and nitrogen that facilitates selective oxidation of the dielectric layer is provided herein. In some embodiments, such methods may include providing a substrate having a dielectric layer comprising silicon and nitrogen disposed thereon, forming reactive species from a process gas comprising hydrogen ($H_2$) and nitrogen trifluoride ($NF_3$) using a remote plasma; and etching the dielectric layer using the reactive species. In some embodiments, the process gas may further comprise ammonia ($NH_3$).

In some embodiments, an oxide layer is disposed adjacent to the dielectric layer. In some embodiments, an etch selectivity of the dielectric layer to the oxide layer is greater than 1, and up to about 4. In some embodiments, the etch selectivity of the dielectric layer to the oxide layer is greater than 0.8, and up to about 1.

In some embodiments, the dielectric layer may have the oxide layer deposited thereon, and the substrate may further comprise a metal silicide. In some embodiments, the etch selectivity of the dielectric layer to the oxide layer is great than 1, and up to about 4; and the etch selectivity of the dielectric layer to the metal silicide layer is greater than 1.

In some embodiments, the dielectric layer may have the oxide layer disposed therebelow, and the substrate may further comprise silicon. In some embodiments, the etch selectivity of the dielectric layer to the oxide layer is great than 1, and up to about 4; and the etch selectivity of the dielectric layer to the substrate is greater than 1.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The above drawings are not to scale and may be simplified for illustrative purposes.

DETAILED DESCRIPTION

Embodiments of the present invention provide methods for etching dielectric layers comprising silicon and nitrogen on a substrate. Embodiments of the present invention may advantageously provide selective etching of the dielectric layer. In some embodiments, a process gas comprising hydrogen ($H_2$), nitrogen trifluoride ($NF_3$), and, optionally, ammonia ($NH_3$) may be used to form a plasma. By adjusting the flow rate ratio of the constituents of the process gas, the etch selectivity of the dielectric layer to an oxide layer may be controlled between about 0.8 to about 4, thereby facilitating processing flexibility in etching the dielectric layer. In some embodiments, the selective etching methods may selectively remove at least portions of the dielectric layer, either isotropically or anisotropically. In some embodiments, the etch selectivity of the dielectric layer to at least one of a metal, a metal silicide, or an oxide layer may be greater than 1, and/or up to about 4. Hence, the inventive process facilitates the selective etching of a dielectric layer.

Figure 1:
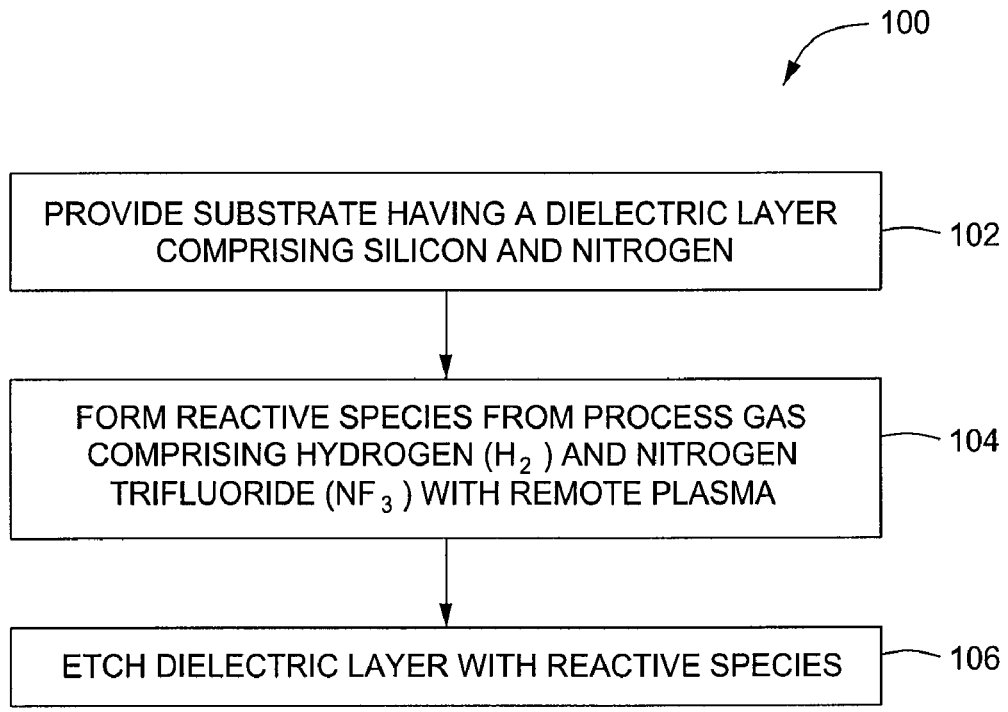
FIG. 1 depicts a flow chart of a process for etching a dielectric layer in accordance with some embodiments of the present invention.

FIG. 1 depicts a method 100 for etching a dielectric layer comprising silicon and nitrogen. The method 100 is described with reference to FIGS. 2A-B, which depicts partially fabricated semiconductor structures corresponding to the method of FIG. 1. The method 100 may be performed in any suitable etch chamber, such as the SICONI™ Preclean process chamber, available from Applied Materials, Inc. of Santa Clara, Calif., or other suitable etch chamber, such as described below with respect to FIG. 5. The etch chamber may be a standalone chamber, or part of a cluster tool, such as one of the ENDURA® line of cluster tools, also available from Applied Materials, Inc.

Figure 2:
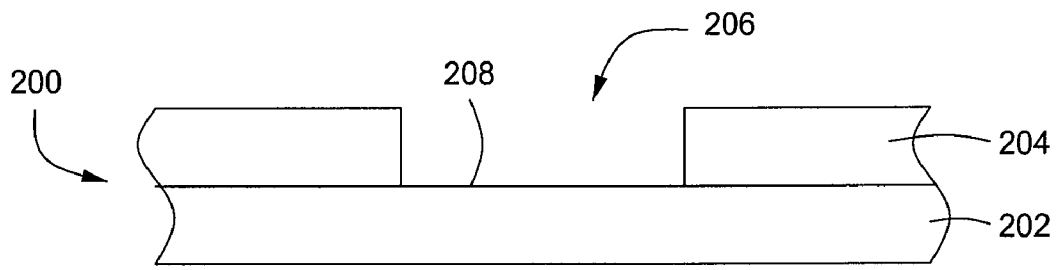
FIG. 2 depicts a schematic side view of a semiconductor substrate suitable for processing in accordance with embodiments of the present invention.

FIG. 2 depicts an illustrative schematic representation of a substrate 200 suitable for processing in accordance with some embodiments of the present invention. The substrate 200 may include one or more partially formed semiconductor structures formed therein or thereon. Such semiconductor structures may include metal interconnect structures, dual damascene structures, transistor devices, flash memory devices, dynamic random access memory devices, or any such semiconductor structure requiring selective etching of a silicon and nitrogen containing dielectric layer using the methods described herein. Although the method 100 described below is illustrated with respect to a semiconductor substrate 200 as depicted in FIG. 2, the method 100 may be applied to any suitable application such as those illustratively depicted in FIGS. 3A-B and 4A-B, and further to any other suitable semiconductor structure that may benefit from the tunable etch methods described herein.

The method 100 begins at 102, where the substrate 200 is provided. The substrate 200 may be any suitable substrate, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, or the like. In some embodiments, the substrate 200 may be a semiconductor wafer (e.g., a 200 mm, 300 mm, or the like silicon wafer).

The substrate 200 may optionally have other layers formed therein or thereon, such as dielectric and conductive materials (not shown) that may form other devices, conductive traces, or the like. For example, in some embodiments, and as depicted in FIG. 2, the substrate 200 illustratively includes at least a first layer 202 having a second layer 204 disposed thereon. Depending upon the application, the first and second layers 202, 204 may have a variety of compositions.

For example, one of the layers 202, 204 may be a dielectric layer comprising silicon and nitrogen. In some embodiments, the dielectric layer may comprise silicon nitride ($Si_3N_4$), nitrogen doped silicon carbide (SiNC), oxygen and nitrogen doped silicon carbide (SiONC), or the like.

The other of the first or second layer 202, 204 (e.g., the non-silicon and nitrogen containing dielectric layer) may comprise a material that is to be etched selectively to the dielectric layer, or alternatively, that is desired not to be etched while etching the dielectric layer. In some embodiments, the other layer may comprise silicon, polysilicon, or a silicide—such as a metal silicide. Suitable metal silicides may include nickel silicide (NiSi), nickel platinum silicide (NiPtSi), and cobalt silicide ($CoSi_2$). In some embodiments, the other layer may comprise an oxide layer, such as a silicon dioxide ($SiO_2$) layer.

In some embodiments, the second layer 204 may include at least one feature 206 disposed therein. Such features may include trenches, vias, openings, gaps, or other high aspect ratio features. As illustratively depicted in FIG. 2, the second layer 204 comprises a feature 206 that exposes a surface 208 of the first layer 202 to be etched by the inventive methods described herein. Accordingly, the methods described herein may be utilized to etch the feature 206 into the second layer 204 (for example, to etch a feature into a silicon and nitrogen containing dielectric layer without substantially harming the underlying layer), to clean the surface 208 of the first layer (for example, to clean residual silicon and nitrogen containing material or to remove a native oxide layer therefrom), or the like. Thus, the inventive methods disclosed herein may suitably be utilized to etch the first layer 202 selectively to the second layer 204 or to etch the second layer 204 selectively to the first layer 202. In addition, the relative compositions of the layers may vary in a given application (for example, the silicon and nitrogen containing dielectric layer may be disposed beneath, or between, other layers). Examples of some such applications are discussed in more detail below with respect to FIGS. 3A-B and 4A-B.

Next, at 104, a reactive species may be formed from an etchant gas using a plasma. In some embodiments, the plasma may be a remote plasma. The etchant gas may include hydrogen ($H_2$) and nitrogen trifluoride ($NF_3$). In some embodiments, the etchant gas may also include ammonia ($NH_3$). In some embodiments, the etchant gas may also include one or more inert gases, such as argon (Ar), helium (He), or the like.

In some embodiments, the etchant gas may be supplied to the etch chamber at a total gas flow of from about 50 to about 1000 sccm. In some embodiments, the etchant gas may comprise between about 10 to about 90 percent hydrogen ($H_2$) gas. In some embodiments, the etchant gas may comprise between about 10 to about 90 percent ammonia ($NH_3$) gas. In some embodiments, the etchant gas may comprise between about 20 to about 80 percent inert gas.

While not intending to be bound by theory, it is believed that adjusting the amount of hydrogen gas and/or nitrogen trifluoride gas provided during the etch process, advantageously controls (e.g., increases or decreases) an etch selectivity of the silicon and nitrogen containing dielectric layer with respect to the other layer. In some embodiments, increasing the flow rate of hydrogen in the etchant gas may increase the etch selectivity of the silicon and nitrogen containing dielectric layer with respect to an oxide layer. In some embodiments, increasing the flow rate of nitrogen trifluoride in the etchant gas may increase the etch selectivity of the silicon and nitrogen containing dielectric layer with respect to an oxide layer.

In some embodiments, the flow ratio of $NF_3:H_2$ may be between about 1:1 to about 1:10. By adjusting the flow rate ratio within the range above, the etch selectivity of the silicon and nitrogen containing dielectric layer to a layer comprising silicon oxide ($SiO_2$) may be controlled between about 0.8 to about 4. In some embodiments, the flow ratio of $NF_3:H_2$ may be between about 1:1 to about 1:2, thereby providing a selectivity of the silicon and nitrogen containing dielectric layer to the oxide layer that is greater than one. In some embodiments, the flow ratio of $NF_3:H_2$ may be between about 1:2 to about 1:10, thereby providing a selectivity of the silicon and nitrogen containing dielectric layer to the oxide layer that is less than one.

Figure 5:
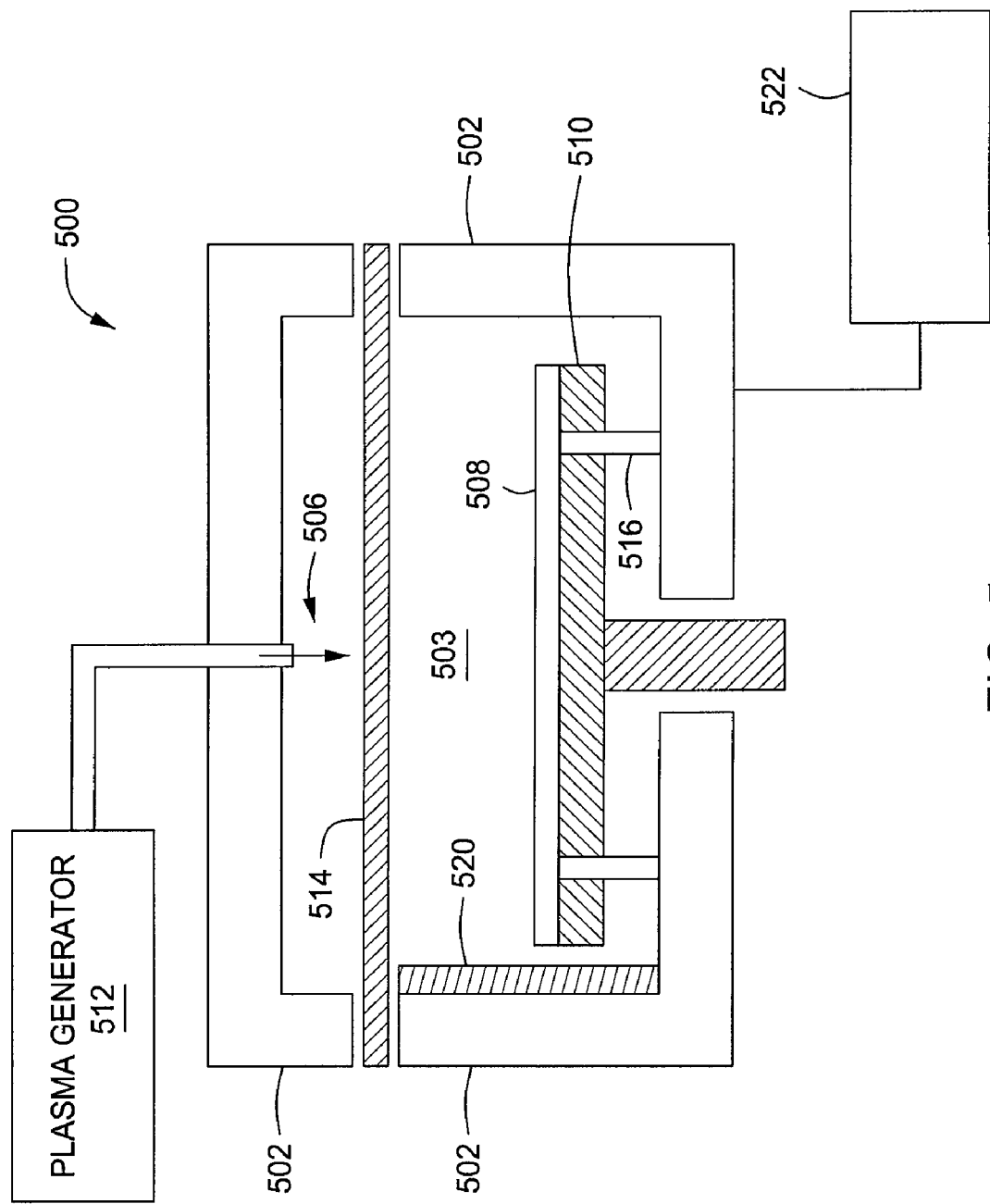
FIG. 5 depicts an etch reactor suitable for performing portions of the present invention.

The plasma may be formed from the etchant gas in any suitable manner, such as by coupling a radio frequency (RF) source power to the process gas to dissociate and ionize the process gas mixture. For example, between about 5 to about 3000 Watts of RF source power may be provided at a frequency of about 100K to about 64 MHz. In one embodiment, about 10 to about 200 Watts of RF source power is supplied at a frequency of about 100 kHz. In some embodiments, the plasma may be formed remotely from the processing volume of the process chamber in which the etch process is performed and may be directed towards (such as by utilizing a remote plasma source, as shown in FIG. 5 below).

Next, at 106, the silicon and nitrogen containing dielectric layer (or other layers) of the substrate 200 may be etched using the reactive species. For example, the plasma, or the reactive species produced therefrom, may be introduced into an etch chamber having the substrate 200 disposed therein to etch a desired portion of the substrate 200. In some embodiments, the silicon and nitrogen containing dielectric layer may be etched. In some embodiments, the other layer may be etched, or the exposed surface 208 may be etched (e.g., cleaned).

In some embodiments, the plasma may be directed towards the substrate 200 by providing an RF bias power to a substrate support upon which the substrate 200 is disposed. In some embodiments, between about 50 to about 500 Watts of RF bias power may be provided at a frequency of about 2 to about 64 MHz. In some embodiments, about 50 to about 200 Watts of RF bias power is supplied at a frequency of about 2 to about 4 MHz.

The temperature and pressure of the etch chamber may be regulated during processing to maintain an environment suitable for etching the desired layer of the substrate 200. For example, the temperature of the substrate support may be controlled in a range of between about 35 to about 80 degrees Celsius. In some embodiments, control of the temperature of the substrate support may facilitate control over the etch selectivity of the silicon and nitrogen containing dielectric layer with respect to silicon oxide. For example, in some embodiments, increasing the temperature of the substrate support (and thereby, of the substrate), increases the selectivity of the silicon and nitrogen containing dielectric layer with respect to silicon oxide. The pressure may be maintained in range of between about 5 to about 500 mtorr.

Upon completion of the etching of the substrate 200, the method 100 generally ends and the substrate may continue to be processed as necessary to complete the fabrication of devices and/or structures thereupon. However, the method 100 may advantageously be applied to other types of semiconductor structures, such as those depicted in FIGS. 3A-B and 4A-B and any other processes where a silicon nitride dielectric material is desired to be etched with controlled selectivity to silicon, polysilicon, silicides, silicon oxide, and the like.

FIGS. 3A-B and 4A-B respectively depict illustrative schematic representations of partially fabricated semiconductor structures in accordance with some embodiments of the present invention. Such semiconductor structures may include transistor devices, flash memory devices, dynamic random access memory devices, metal interconnect structures, dual damascene structures, or any such semiconductor structure requiring selective etching of a silicon and nitrogen containing dielectric layer using the tunable selectivity processes described herein.

Figure 3A:
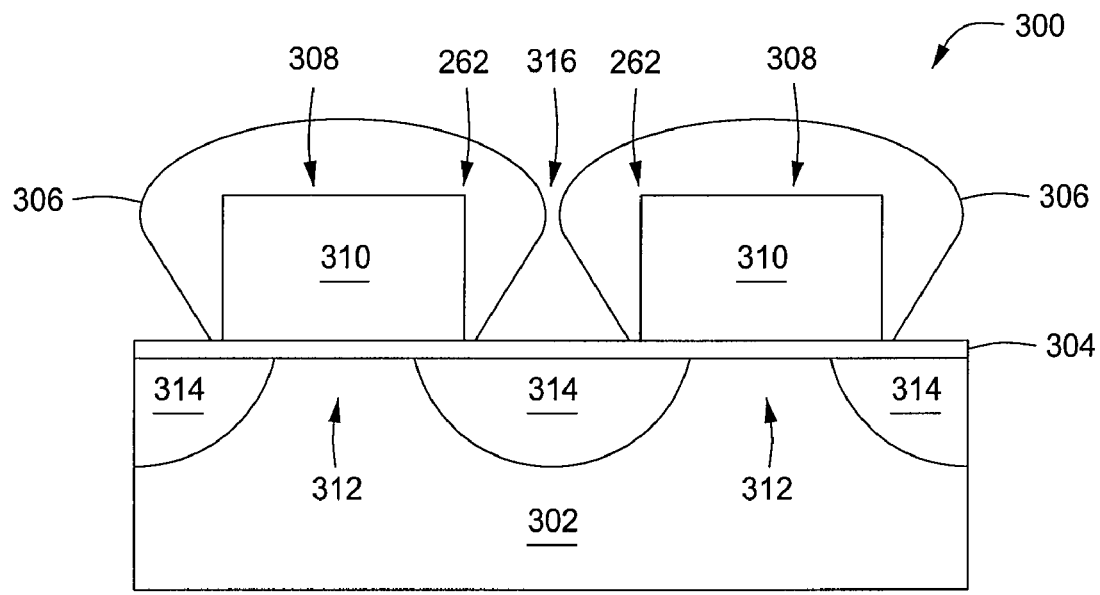
FIGS. 3A-B respectively schematically depict stages of fabrication of a semiconductor structure in accordance with some embodiments of the process of FIG. 1.
Figure 3B:
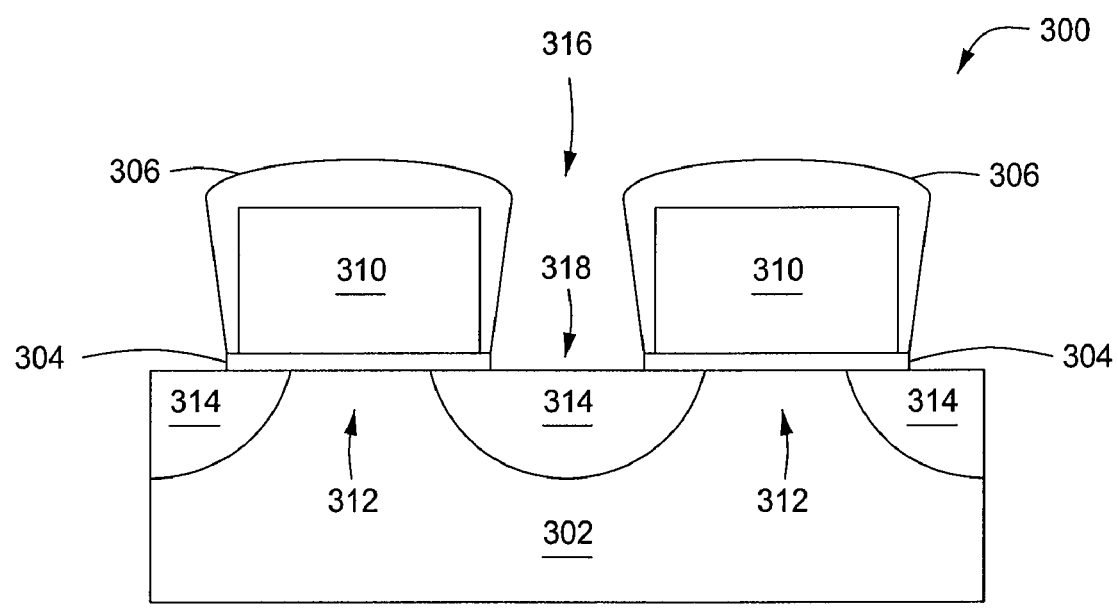

For example, embodiments of the inventive method 100 may suitably be utilized in a contact clean process, as shown in FIGS. 3A-B. As shown in FIG. 3A, a substrate 302 may be provided having a partially fabricated semiconductor structure 300 disposed thereon. The substrate 302 may be any suitable substrate such as discussed above with respect to FIG. 2.

The partially fabricated semiconductor structure 300 may have a silicon and nitrogen containing dielectric layer 306, for example, used as a spacer structure disposed atop adjacent transistors 308 formed on a substrate 302. Each of the transistors 308 may include an oxide layer 304 formed atop the substrate 302. The oxide layer 304 may be a gate dielectric layer. In some embodiments, the oxide layer 304 may be made of, for example, silicon dioxide ($SiO_2$). In some embodiments, the oxide layer 304 may be made of, for example, a high-k dielectric material, e.g., aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_4$), yttrium oxide ($Y_2O_3$), lanthanum oxide ($La_2O_3$), cerium oxide ($CeO_2$), titanium oxide ($TiO_2$), tantalum oxide ($Ta_2O_5$), other dielectric material or combinations thereof. The oxide layer 304 may be formed by, for example, a chemical vapor deposition (CVD) process, a physical vapor deposition (PVD) process, or other suitable semiconductor processes that are adapted to form a gate dielectric material layer.

Each transistor 308 may have a transistor gate 310 formed atop the oxide layer 304. The transistor gate 310 may be made of, for example, polysilicon; amorphous silicon; a metallic material, e.g., Ru, Ti, Ta, W, Hf, Cu, Al; metal nitride; metal oxide such as $RuO_2$ or $IrO_2$; metal nitride such as MoN, WN, TiN, TaN, TaAlN; gate silicide such as $CoSi_2$ or NiSi; other metallic material that is adapted to be used for transistor gates, or various combinations thereof. In some embodiments, the transistor gate 310 may be formed by a CVD process, a PVD process, an electrochemical plating process, an electroless plating process or combinations thereof.

Each transistor gate 310 may be formed above a transistor channel 312, the channel 312 formed between contact regions 314, e.g., source/drain regions. The contact regions 314 may be formed within the substrate 302 and adjacent to the oxide layer 304. The contact regions 314 may have n-type dopants such as phosphorus and arsenic or p-type dopants such as boron, depending on the type of transistor (e.g., NMOS or PMOS) being formed. In some embodiments, the contact regions 314 may be formed by an implant process. In some embodiments, the contact regions 314 may include at least one lightly doped drain (LDD).

The silicon and nitrogen containing dielectric layer 306 may be formed on the sidewalls and atop each transistor gate 310. The silicon and nitrogen containing dielectric layer 306 may be configured as a spacer to protect each transistor gate 310 and/or to serve as a mask for implanting ions into the substrate 302 to form the contact regions 314. While not shown, the spacer can comprise multiple layers, at least one of which is silicon and nitrogen containing dielectric layer 306. In such embodiments, the inventive methods described herein may provide etch selectivity of the silicon and nitrogen containing dielectric layer 306 relative to other spacer layers, and/or selectivity relative to oxide layer 304.

The silicon and nitrogen containing dielectric layer 306 may have a pinch-off and/or negative profiles proximate the corners 362 and sidewalls of each transistor gate 310. The pinch-off and/or negative profiles of the silicon and nitrogen containing dielectric layer 306 may result in a void or seam between each transistor gate 310 if a thick silicon and nitrogen containing dielectric layer 306 is formed on each transistor gate 310. In some embodiments, and as illustrated in FIG. 3A, the pinch-off profile includes a non-uniform area 316 disposed between the adjacent transistor gates 310. In some embodiments, at the base of the non-uniform area 316 may be an exposed portion of the oxide layer 304.

The negative profiles of the dielectric layer 306 proximate the corners and sidewalls of each transistor gate 310 may require selective removal to more fully expose the oxide layer 304. For example, as depicted in FIG. 3A, the negative profiles of the dielectric layer 306 form a non-uniform area 316 having a narrow width proximate the corners 362 of the adjacent transistor gates 310. In such a configuration, the narrow width may prevent an etchant from sufficiently etching the exposed portion of the oxide layer 304.

Accordingly, the inventive methods disclosed herein may be advantageously utilized to open up the width of the non-uniform area 316. For example, in some embodiments, and illustrated in FIG. 3B, the negative profiles of the dielectric layer 306 may be selectively etched to increase the width of the non-uniform region 316 providing a larger opening for an etchant to remove the exposed portion of the oxide layer 304 below without damaging the surface of the contact region 314. The selective etching may be performed utilizing the method 100 described above with respect to FIG. 2. Moreover, the selective etch process advantageously may provide a selectivity of silicon and nitrogen containing dielectric materials over silicon oxide over silicon, thereby facilitating etching away the thin silicon oxide layer 304 disposed between the adjacent transistor gates 310 without harming the underlying layer. Once, the exposed portion of the oxide layer 304 is removed, a conductive material (not shown) such as a metal, or any suitable material for forming an electrical contact with the contact region 314 may be deposited on the exposed surface of the contact region 314.

Figure 4A:
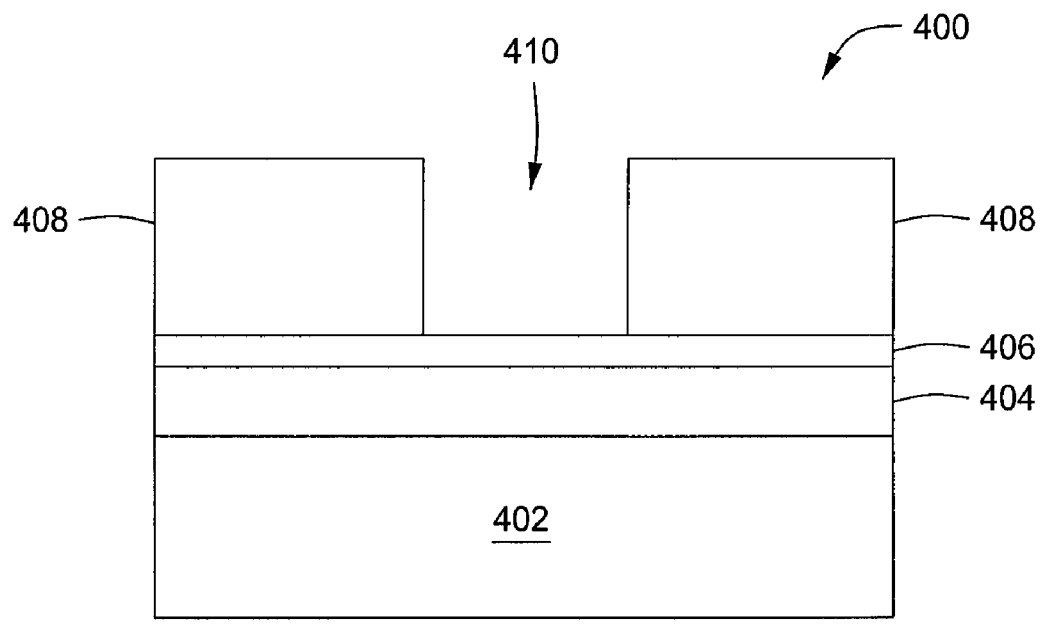
FIGS. 4A-B respectively schematically depict stages of fabrication of a semiconductor structure in accordance with some embodiments of the process of FIG. 1.
Figure 4B:
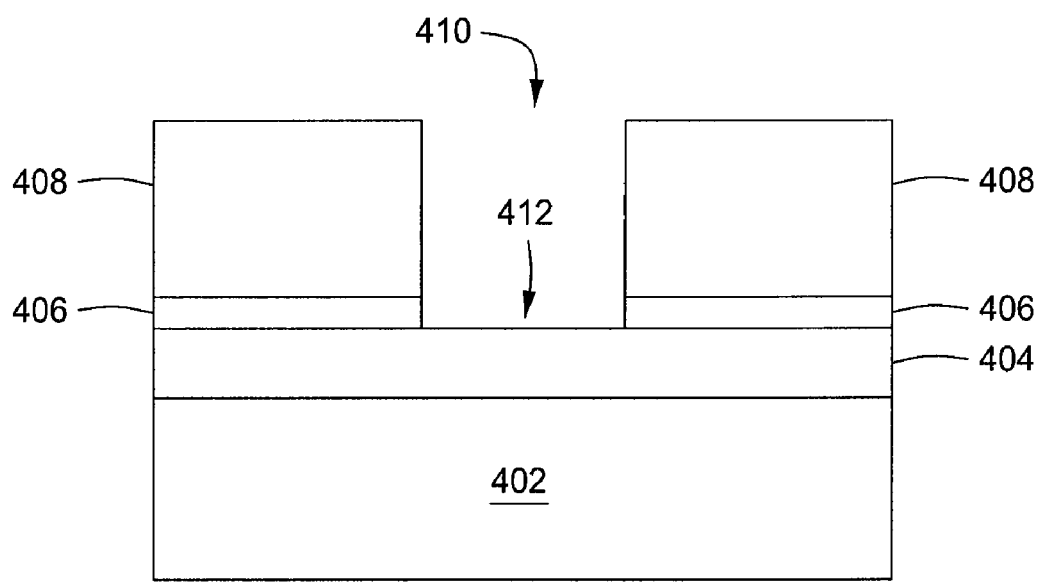

In another exemplary application, the inventive methods as described above may be utilized in the selective removal of a barrier layer (i.e., dielectric layer 406), as depicted in FIGS. 4A-B. The semiconductor structure 400 depicted in FIG. 4A includes a dielectric layer 406 disposed atop a semiconductor substrate 402 and a conductive layer 404. An oxide layer 408 is disposed atop the dielectric layer 406. The oxide layer 408 may include at least one feature disposed therein. Such features may include trenches, openings, gaps, or other high aspect ratio features. As illustrated in FIG. 4A, the oxide layer 408 comprises a feature 410, which exposes a portion of the dielectric layer 406. The dielectric layer 406, semiconductor substrate 402, oxide layer 408 and conductive layer 404 may be any suitable materials for use with the inventive method 100 as described above. In one embodiment, the substrate 402 may comprise silicon, the conductive layer 404 may be a metal silicide, and the dielectric layer 406 may comprise silicon and nitrogen.

In some embodiments, and as described above, the etch selectivity may be adjusted to favor etching the exposed portion of the dielectric layer 406 disposed at the base of the feature 410 while preventing damage and/or removal of the oxide layer 408.

Upon removal of the exposed portion of the dielectric layer 406 as depicted in FIG. 4B, a residue 412 may be remain and/or be deposited atop the exposed surface of the conductive layer 404. Such residue 412 may be unreacted remnants of the dielectric layer 406 and/or the oxide layer 408, or byproducts of the etchant gases. The residue 412 may form a partial covering of the exposed portion of the conductive layer 404. In some embodiments, and as discussed above the flow rate of process gases may be adjusted to favor removal of the residues of the silicon and nitrogen containing dielectric layer without substantially damaging and/or removing the conductive layer 404 or the oxide layer 408.

Once, the exposed portion of the dielectric layer 406 is removed and/or the exposed surface of the conductive layer is free of residues, the feature 410 may be filled (not shown) with any suitable material, such as a metal, for forming an electrical contact with the conductive layer 404.

While described above for the specific embodiments of FIGS. 2-4, it is contemplated that any semiconductor structure requiring the selective etch of at least a portion of a dielectric layer comprising silicon and nitrogen, either isotropically or anisotropically, and further in the presence of an oxide, metal, metal silicide, and/or silicon-containing layer may benefit from the inventive methods described herein. Additional examples of suitable embodiments are described in previously incorporated U.S. patent application Ser. No. 11/876,649, filed Oct. 22, 2007 by Li-Qun Xia, entitled, "Methods and Systems for Forming At Least One Dielectric Layer."

The etch methods described herein may be performed in any suitable etch chamber, such as the SICONI™ Preclean process chamber, available from Applied Materials, Inc. of Santa Clara, Calif., or other suitable etch chamber, such as described below with respect to FIG. 5. The etch chamber may be part of a cluster tool, such as one of the ENDURA® line of cluster tools, also available from Applied Materials, Inc.

FIG. 5 is a schematic cross-sectional view of an exemplary etch chamber 500. The etch chamber 500 may include a chamber wall 502 enclosing a processing volume 503 and having a remote plasma generator 512 coupled thereto. The remote plasma generator 512 is configured to generate the plasma 506. The plasma generator 512 may be fluidly coupled to the processing volume 503 via a plasma distribution apparatus 304 such as a tube, pipe and/or manifold for delivering the process plasma 506 to the processing volume 503. Disposed within the processing volume 503 may be a substrate support pedestal 510 having a substrate 508 disposed thereon. The process plasma 506 may be delivered to the substrate 508 via a showerhead 514 that is position above the substrate 508. The substrate 508 may be moved controllably between a lower position/upper position near to a showerhead 514 by pins 516. The substrate 508 may include the semiconductor structures described in FIGS. 2A-B.

In some embodiments, the plasma distribution apparatus 304 may introduce the plasma 506 generated from the process gas into the processing chamber 500. In some embodiments, the supply line for the etch plasma 506 may include (i) several safety shut-off valves (not shown) that can be used to automatically or manually shut-off the flow of process plasmas into the chamber, and (ii) mass flow controllers (not shown) that measure the flow of the plasma 506 through the supply line.

The chamber wall 502 may have a temperature to substantially prevent condensations of etchants and/or byproducts thereon. The pedestal 510 may be operative to provide a desired temperature between about −100° C. and about 1000° C. to condense etchants on the surface of the substrate 508. The etchants then may desirably interact with the dielectric layers and additional layers as describe in the embodiments above.

In some embodiments, at least one pumping channel 520 may be configured within the etch chamber 500 to desirably remove byproducts such as excess process gases and/or decomposed gases from the etch chamber 500. The pumping channel 520 may be coupled to, for example, a pump or motor, such that the byproducts may be desirably removed. In some embodiments, the pumping channel 520 may have at least one aperture (not shown) through which the byproducts can be desirably removed.

In some embodiments, an RF power supply (not shown) may be coupled to the plasma generator 512 to excite the process gas to form the plasma 506. The RF power supply may be operative to provide a RF power between about 5 watts and about 3,000 watts. The RF power supply may supply the power at a RF frequency between about 100 kHz and about 64 MHz.

Returning to FIG. 5, a system controller 522 may be coupled to the process chamber 500, and may controls all of the activities of the etch system. The system controller executes system control software, which is a computer program stored in a computer-readable medium such as a memory. In some embodiments, the memory is a hard disk drive, but the memory may also be other kinds of memory. The computer program includes sets of instructions that dictate the timing, mixture of gases, chamber pressure, chamber temperature and other parameters of a particular process. Other computer programs stored on other memory devices including, for example, a floppy disk or other another appropriate drive, may also be used to operate controller. In embodiments, where the process chamber 500 is coupled to a cluster tool (not shown), the computer readable medium for performed the selective etch methods described herein may be stored in, and executed from, a system controller (not shown) of the cluster tool.

A process for selectively etching the dielectric layer can be implemented using a computer program product that is executed by the controller described above. The computer program code can be written in any conventional computer readable programming language: for example, 68000 assembly language, C, C++, Pascal, FORTRAN or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft WindowsGY library routines. To execute the linked, compiled object code the system user invokes the object code, causing the computer system to load the code in memory. The CPU then reads and executes the code to perform the tasks identified in the program.

Thus, embodiments of methods for etching a dielectric layer on a substrate are provided herein. The inventive methods may advantageously provide selective etching of the dielectric layer. In some embodiments, a process gas comprising hydrogen ($H_2$), and nitrogen trifluoride ($NF_3$), and optionally ammonia ($NH_3$), may be used to form a plasma. By adjusting the flow rate ratio of the process gas, the etch selectivity of the dielectric layer may be about 0.8 to about 4. In some embodiments, the selective etching methods may selectively remove at least portions of the dielectric layer, either isotropically or anisotropically. In some embodiments, the etch selectivity of the dielectric layer to at least one of a metal, metal silicide, and oxide layer may be greater than 1, and up to about 4. Hence, the inventive process facilitates the selective removal of at least portions of a dielectric layer.

While the foregoing is directed to embodiments of the present invention, other and further embodiments of the invention may be devised without departing from the basic scope thereof, and the scope thereof is determined by the claims that follow.

What is claimed is:

1. A method for etching a dielectric layer comprising:
    providing a substrate having a dielectric layer comprising silicon and nitrogen and an oxide layer disposed adjacent to the dielectric layer;
    forming reactive species from a process gas comprising hydrogen ($H_2$) and nitrogen trifluoride ($NF_3$) using a remote plasma; and
    etching the dielectric layer using the reactive species, wherein an etch selectivity of the dielectric layer to at least one of the oxide layer or the substrate is between about 0.8 to about 4.

2. The method of claim 1, wherein the oxide layer includes silicon dioxide ($SiO_2$).

3. The method of claim 1, wherein the oxide layer comprises a gate oxide layer of a transistor device.

4. The method of claim 1, wherein the oxide layer is disposed above the dielectric layer and includes a feature defined therein that at least partially exposes the dielectric layer.

5. The method of claim 1, wherein the dielectric layer includes at least one of silicon nitride (SiN), nitrogen doped silicon carbide (SiNC), or oxygen and nitrogen doped silicon carbide (SiONC).

6. The method of claim 1, wherein the substrate further comprises at least one of silicon, polysilicon, a metal silicide, n-doped silicon, or p-doped silicon.

7. The method of claim 1, wherein the flow rate ratio of $NF_3:H_2$ is between about 1:1 to about 1:10.

8. The method of claim 1, wherein the process gas comprises nitrogen trifluoride ($NF_3$), ammonia ($NH_3$), and hydrogen ($H_2$).

9. The method of claim 1, wherein etching the dielectric layer further comprises:
    maintaining a substrate support pedestal upon which the substrate is disposed at a temperature of between about 35 to about 80 degrees Celsius.

10. A computer readable medium comprising instructions that, when executed by a processor, causes a process chamber to perform a method of etching a substrate disposed in the process chamber and having a dielectric layer comprising silicon and nitrogen and an oxide layer disposed adjacent to the dielectric layer, the method comprising:
    forming reactive species from a process gas comprising hydrogen ($H_2$) and nitrogen trifluoride ($NF_3$) using a remote plasma; and
    etching the dielectric layer using the reactive species, wherein an etch selectivity of the dielectric layer to at least one of the oxide layer or the substrate is between about 0.8 to about 4.

11. The computer readable medium of claim 10, wherein the flow rate ratio of $NF_3:H_2$ is between about 1:1 to about 1:10.

12. The computer readable medium of claim 10, wherein the dielectric layer includes at least one of silicon nitride (SiN), nitrogen doped silicon carbide (SiNC), or oxygen and nitrogen doped silicon carbide (SiONC).

13. The computer readable medium of claim 10, wherein the substrate further comprises at least one of silicon, a metal silicide, n-doped silicon, or p-doped silicon.

14. The computer readable medium of claim 10, wherein the temperature is maintained between about 35 to about 80 degrees Celsius.

15. The computer readable medium of claim 10, wherein an etch selectivity of the dielectric layer to a least one of the oxide layer or the substrate is between about 0.8 to about 4.

16. The computer readable medium of claim 10, wherein the process gas comprises nitrogen trifluoride ($NF_3$), ammonia ($NH_3$), and hydrogen ($H_2$).

* * * * *